(12) United States Patent
Thomas et al.

(10) Patent No.: US 6,847,077 B2
(45) Date of Patent: Jan. 25, 2005

(54) CAPACITOR FOR A SEMICONDUCTOR DEVICE AND METHOD FOR FABRICATION THEREFOR

(75) Inventors: Sylvia W. Thomas, Orlando, FL (US); Michael Jay Parrish, St. Cloud, FL (US); Tony G. Ivanov, Orlando, FL (US); Edward Belden Harris, Orlando, FL (US); Richard William Gregor, Winter Park, FL (US); Michael Scott Carroll, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 10 days.

(21) Appl. No.: 10/180,910

(22) Filed: Jun. 25, 2002

(65) Prior Publication Data

US 2003/0234416 A1 Dec. 25, 2003

(51) Int. Cl.[7] .............................................. H01L 27/108
(52) U.S. Cl. ........................ 257/301; 257/303; 257/306
(58) Field of Search .................................. 257/301, 303, 257/306

(56) References Cited

U.S. PATENT DOCUMENTS

| | | | |
|---|---|---|---|
| 5,343,354 A | 8/1994 | Lee et al. | |
| 5,973,348 A | 10/1999 | Ishibashi | |
| 6,153,510 A | 11/2000 | Ishibashi | |
| 6,165,863 A | 12/2000 | Lee et al. | |
| 6,261,964 B1 | 7/2001 | Wu et al. | |
| 6,309,975 B1 | 10/2001 | Wu et al. | |
| 6,426,544 B1 * | 7/2002 | Ryan et al. | 257/532 |
| 6,445,564 B1 * | 9/2002 | Naitoh | 361/301.2 |
| 6,524,908 B2 * | 2/2003 | Cabral et al. | 438/254 |

* cited by examiner

*Primary Examiner*—David Nelms
*Assistant Examiner*—Tu-Tu Ho

(57) ABSTRACT

A semiconductor device having a capacitor integrated in a damascene structure. In one embodiment, the capacitor is formed entirely within a metallization layer of a damascene structure, having therein a semiconductor device component. Preferably, the capacitor is formed within a trench, having been etched in the dielectric material of the metal layer and the capacitor includes a first capacitor electrode formed within the recess in electrical contact with the device component of the metallization layer. An insulator may be formed over the first capacitor electrode, with a second capacitor electrode formed over the insulator. These elements are preferably conformally deposited within the trench, thereby forming a recess, a portion of which extends within the trench. A subsequently fabricated device component may then be placed in electrical contact with the second capacitor electrode.

15 Claims, 6 Drawing Sheets

CAPACITOR FOR A SEMICONDUCTOR DEVICE AND METHOD FOR FABRICATION THEREFOR

BACKGROUND OF THE INVENTION

The present invention relates in general to fabricating semiconductor devices, and, more specifically, to the integration of capacitors in damascene interconnect structures.

Capacitors are used extensively in electronic devices for storage of electric charge. The capacitors essentially comprise two conductive plates separated by an insulator. The capacitance, or amount of charge held by the capacitor per applied voltage, depends upon the area of the plates, the distance between the plates, and the dielectric values of the insulator. Capacitors are used in filters, analog to digital converters, digital memory devices, and various control applications.

Metal-based capacitors are typically incorporated into a device using a subtractive metal etch process, which is conventionally used to form aluminum lines. However, copper has increased in popularity as a metal of choice for fabrication of metallization layers. Copper has a lower resistivity, which allows for the formation of smaller features than with aluminum metallization. Copper also has a higher melting point relative to aluminum such that subsequent device processing steps may be performed at higher temperatures.

Copper metallization in the context of capacitor fabrication has some drawbacks. Capacitors have been fabricated using damascene processes, which require deposition of copper into a recess formed in a dielectric. Damascene processes require several mask operations presenting the need for extensive optical lithography and etching. In addition, the chemical mechanical polishing of copper may compromise the capacitors reliability, because the surface roughness leads to micro structural differences in materials. Moreover, prior to deposition of copper a barrier layer must be deposited to prevent diffusion of copper into the underlying dielectric.

A need exists to provide a capacitor that can be integrated in damascene interconnect structures without the excessive masking operations required from copper metallization, and minimizes the affects of microstructure differences from underlying copper metallization and the affects of copper diffusion.

SUMMARY OF THE INVENTION

In one form, the invention comprises a capacitor for a semiconductor device in which the capacitor is formed entirely within a dielectric material of a metallization layer, and in electrical contact with a device component fabricated in the metallization layer. The capacitor may be especially convenient for fabrication within a copper interconnect structure fabricated using a damascene process. The capacitor includes a first plate or electrode formed within a trench etched into the dielectric material adjacent to the device component, and comprises a conductive metal or metal alloy such as a refractory metal. An insulator overlays the first capacitor electrode and preferably comprises a dielectric material. A second plate or electrode overlays the insulator, and is also comprised of a conductive metal or metal alloy. For purpose of this description, device component may be a terminal of an electrical component or merely a conductor such as a lead or via.

The capacitor electrodes and insulator are preferably deposited within the trench, lining the trench sidewalls and bottom. In this manner, a recess is formed over the second capacitor electrode in which a conductive metal is deposited forming a metal lead to connect the capacitor to another device component. The metal lead preferably consists of copper or a copper alloy deposited within the recess. The films and conductive metal are then planarized forming a planar top surface of the capacitor that is substantially coplanar with a top surface of the metallization layer. If the capacitor is fabricated within a copper interconnect structure, a metal layer may be fabricated on the device above the capacitor and interconnected by a metal-filled via which contacts the metal lead. In this manner, a capacitor is formed within a metallization layer of a damascene interconnect structure with minimal lithographic and etching steps, in turn, reducing production costs. Moreover, the use of conductive metals, other than copper as the electrodes avoids the necessity of depositing barrier layers.

BRIEF DESCRIPTION OF THE DRAWINGS

Some advantages of the present invention having been stated, others will appear as the description proceeds, when considered in conjunction with the accompanying drawings, which are not necessarily drawn to scale.

DETAILED DESCRIPTION OF THE DRAWINGS

Figure 1:
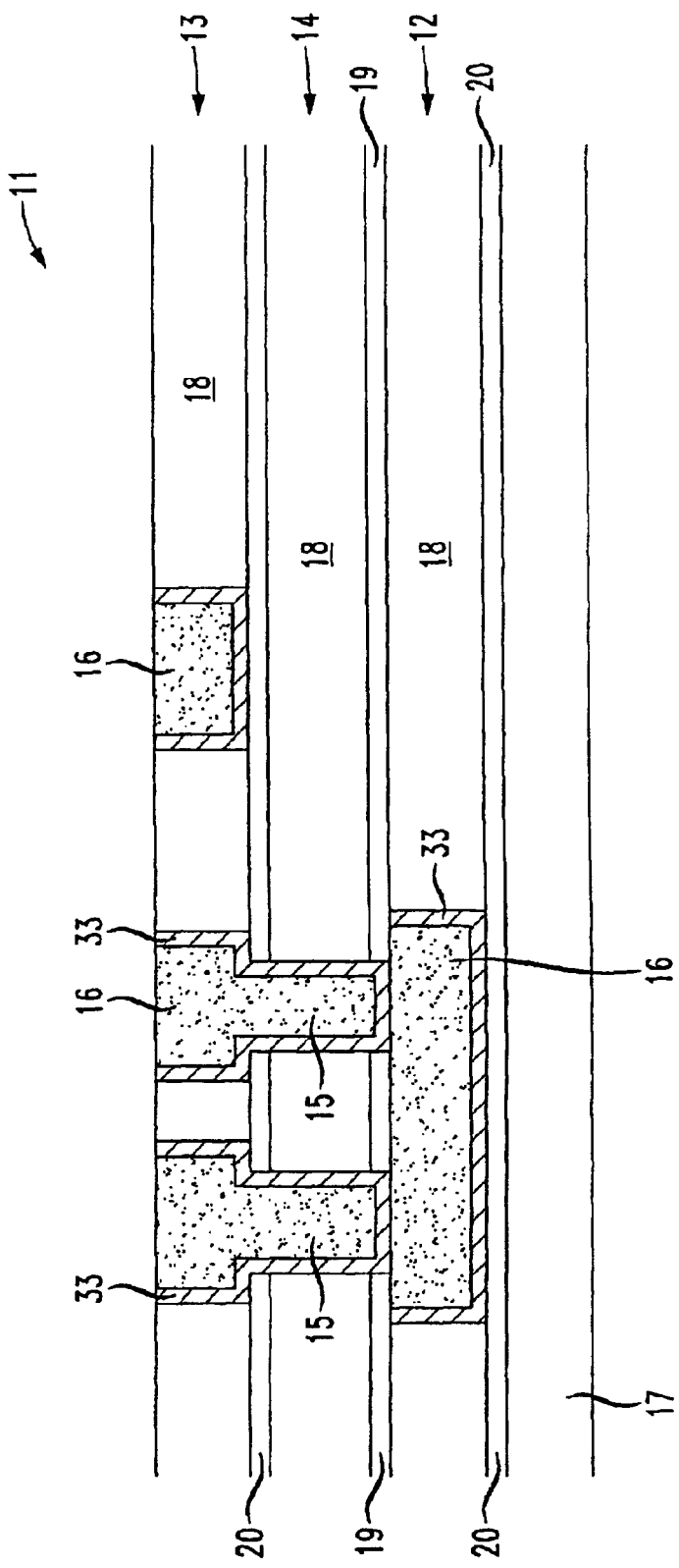
FIG. 1 is a partial sectional view of an interconnect structure of a semiconductor device.

With respect to FIG. 1, an interconnect structure 11 is shown fabricated on a semiconductor wafer or substrate 17. The term wafer or substrate as used in this specification is understood to include structures formed thereon such as transistors, capacitors, tungsten plugs and contact levels, or other active areas on the substrate 17. The interconnect structure includes a lower metallization layer 12, an upper metallization layer 13 and an insulating layer 14 (also referred to as a "dielectric layer") disposed between the upper metallization layer 13 and the lower metallization layer 12. For purposes of this description, the term "metallization layer" refers to the structural layer of a semiconductor integrated circuit within which metal conductors and semiconductors are formed. Metallization layers are alternately deposited, during integrated circuit fabrication, with insulating dielectric layers.

The interconnect structure 11 is typically fabricated using damascene processes which are known to those skilled in the art. The lower metallization layer 12 is fabricated from a single damascene process, and the upper metallization layer 13 and insulating layer 14 are fabricated from a dual damascene process. However, the present invention for a trench capacitor is not necessarily limited to an inter-connect structure fabricated from a single and/or dual damascene processes, but may include metallization layers fabricated using other available fabrication processes.

Each of the metallization layers 12 and 13 includes metal components 16, such as a metal line disposed, and extending, within a dielectric material 18. With respect to the present drawings the component 16 consists generally of conductive metal deposited within a recess formed in the dielectric material 18. For example, copper may be used in which case a seed/barrier film 33 is formed between the dielectric and copper.

Barrier layers 19 seal the components 16 from exposure to materials deposited thereon, and protect components 16 during subsequent fabrication steps. In addition, the barrier layer 19, also referred to as a diffusion barrier layer, minimizes the diffusion of the conductive metal of component 16 into a dielectric material deposited over the metal components 16. The barrier layer 19 may also serve as an etch stop layer during the formation of features etched in the dielectric materials deposited over the lower metallization layer 12. To that end an etch stop layer 20 is interposed between the insulating layer 14 and the upper metallization layer 13, and between the lower metallization layer 12 and the substrate 17. The barrier layer 19 and etch stop layer 20 may include as constituents dielectric materials such as silicon oxides, silicon nitrides and/or silicon carbides or combinations of these materials.

Metal-filled vias or plugs 15 interconnect the components 16 in the upper metallization layer 13 to the components 16 of the lower metallization layer 12. The insulating layer 14 comprises a dielectric material 18 disposed between the plugs 15, and similarly serves as an insulator between the plugs 15, and minimizes inter-level shorting between lines in different device layers. The components 16 and plugs 15 are typically composed of copper or a copper alloy.

Figure 2:
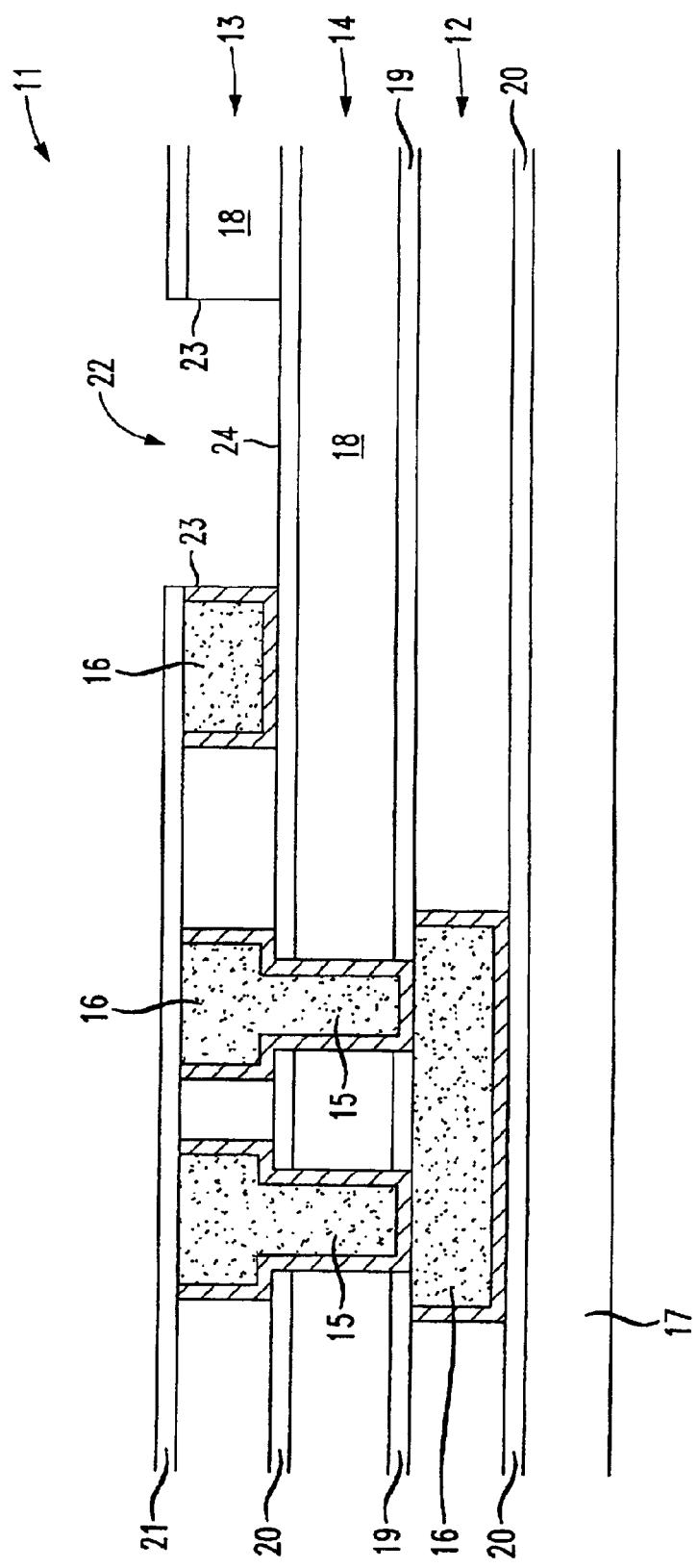
FIG. 2 is a partial sectional view of an interconnect structure of a semiconductor device having a trench etched in a dielectric material of a metal layer.

With respect to FIG. 2, the fabrication of a capacitor is initiated by etching a recess or trench 22 into the dielectric material 18 of the upper metallization layer 13, adjacent to the component 16. The term trench as used in this disclosure is not intended to limit the dimension or shape of the recess, which may be dictated by characteristics of the capacitor to be formed therein. The term trench may include any type of recess formed in the dielectric for purposes of forming a component therein.

A photoresist layer 21 is first exposed over the metallization layer 13. A mask layer (not shown) is typically deposited over the metal layer 13 before the photoresist 21, so the reference to the photoresist layer 21 also includes any mask layer having been formed for purposes of formation of the trench 22. A trench feature is patterned in the photoresist 21, and then etched through the dielectric material 18 to the etch stop layer 20. As shown in FIG. 2, the trench 22 includes opposing sidewalls 23 and a bottom 24. The feature patterned in the photoresist 21 preferably overlaps the underlying component 16, so when the trench 22 is etched in the dielectric 18, a surface of the component 16 is exposed within the trench 22. The photoresist layer 21 is then stripped. Portions of the mask layer (not shown) may remain to form a diffusion barrier on the upper metal layer 13.

Figure 3:
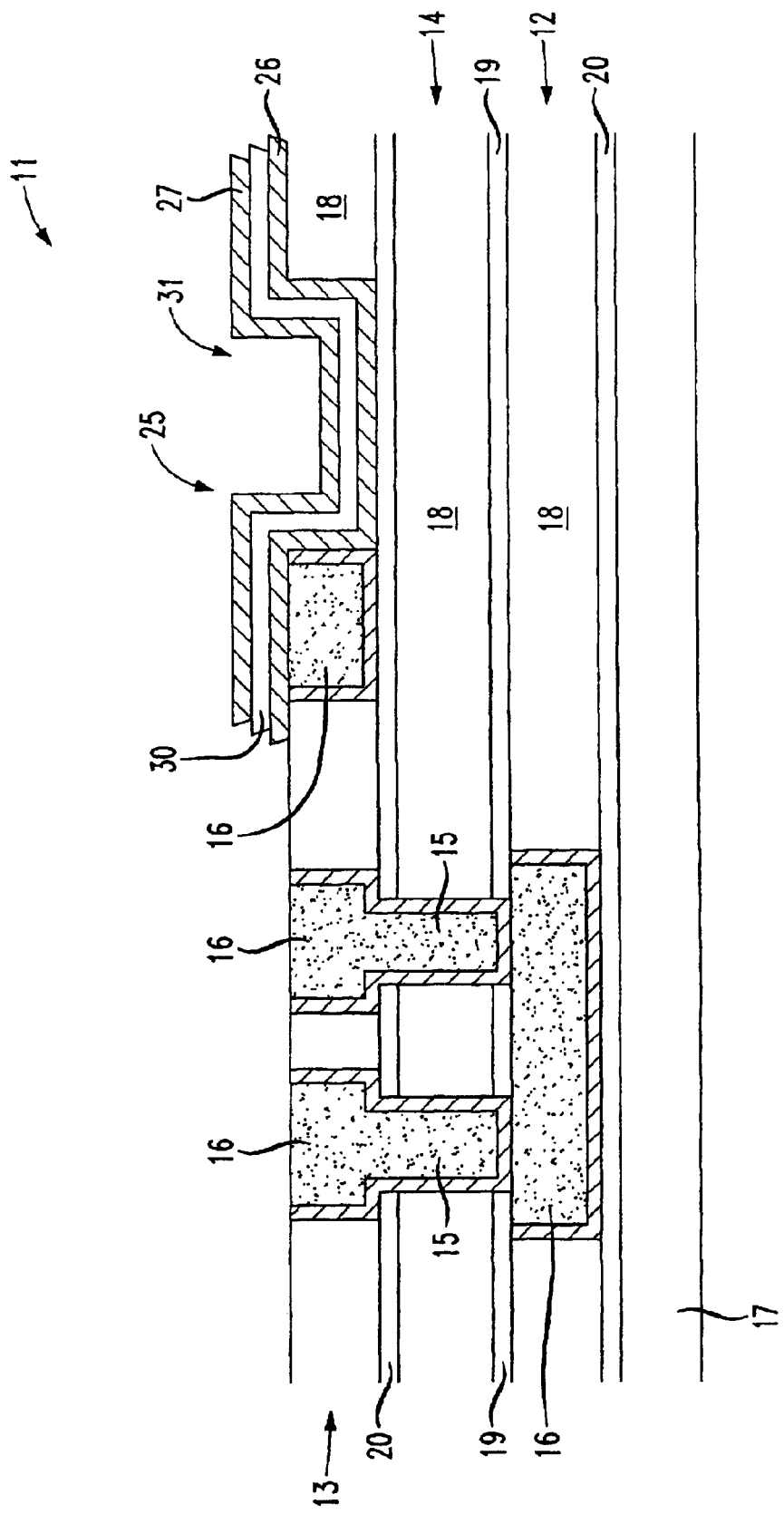
FIG. 3 is a partial sectional view of an interconnect structure of a semiconductor device having films deposited thereon for fabrication of a capacitor.
Figure 4:
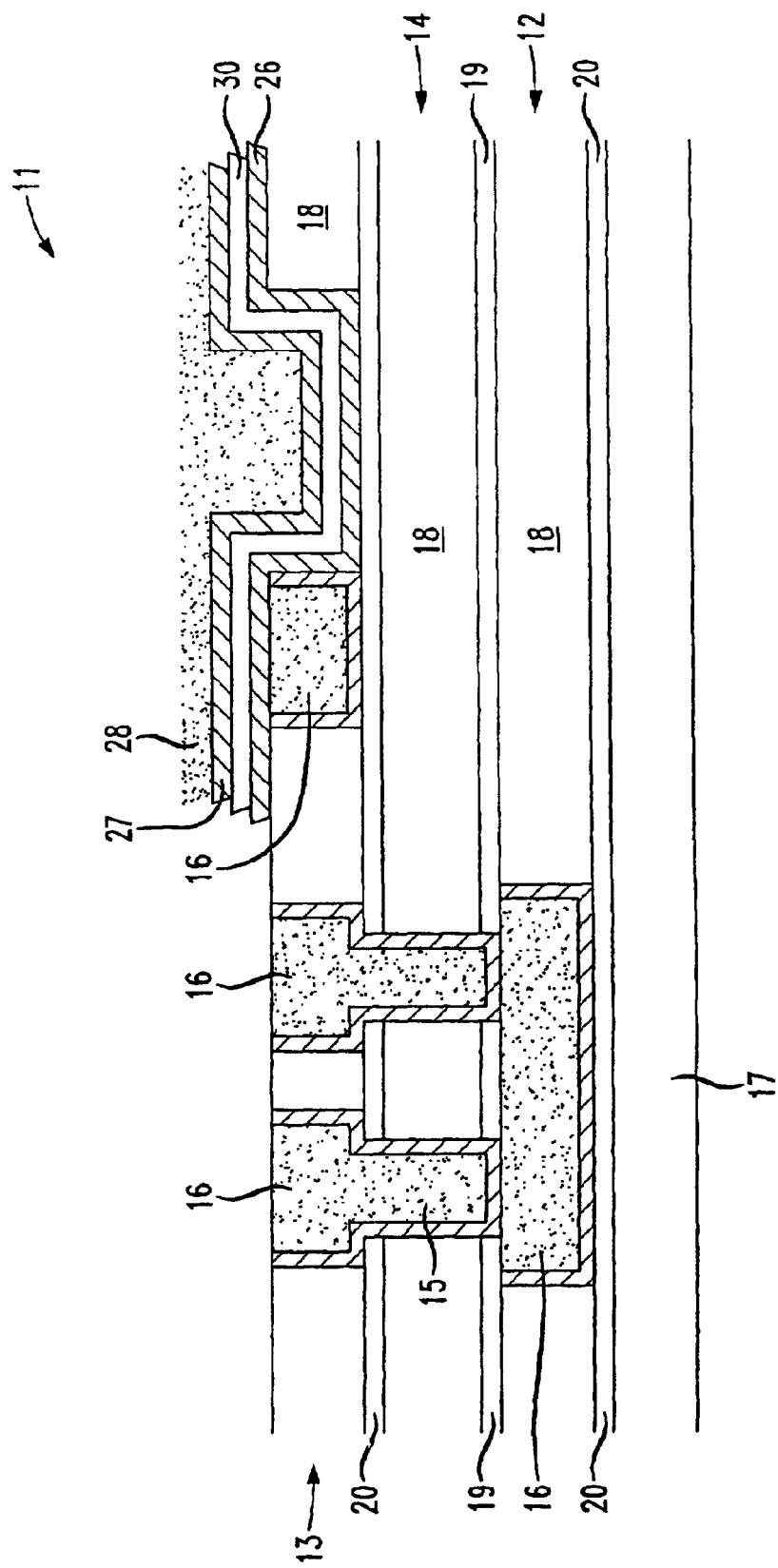
FIG. 4 is a partial sectional view of an interconnect structure having a conductive metal deposited over the films.
Figure 5:
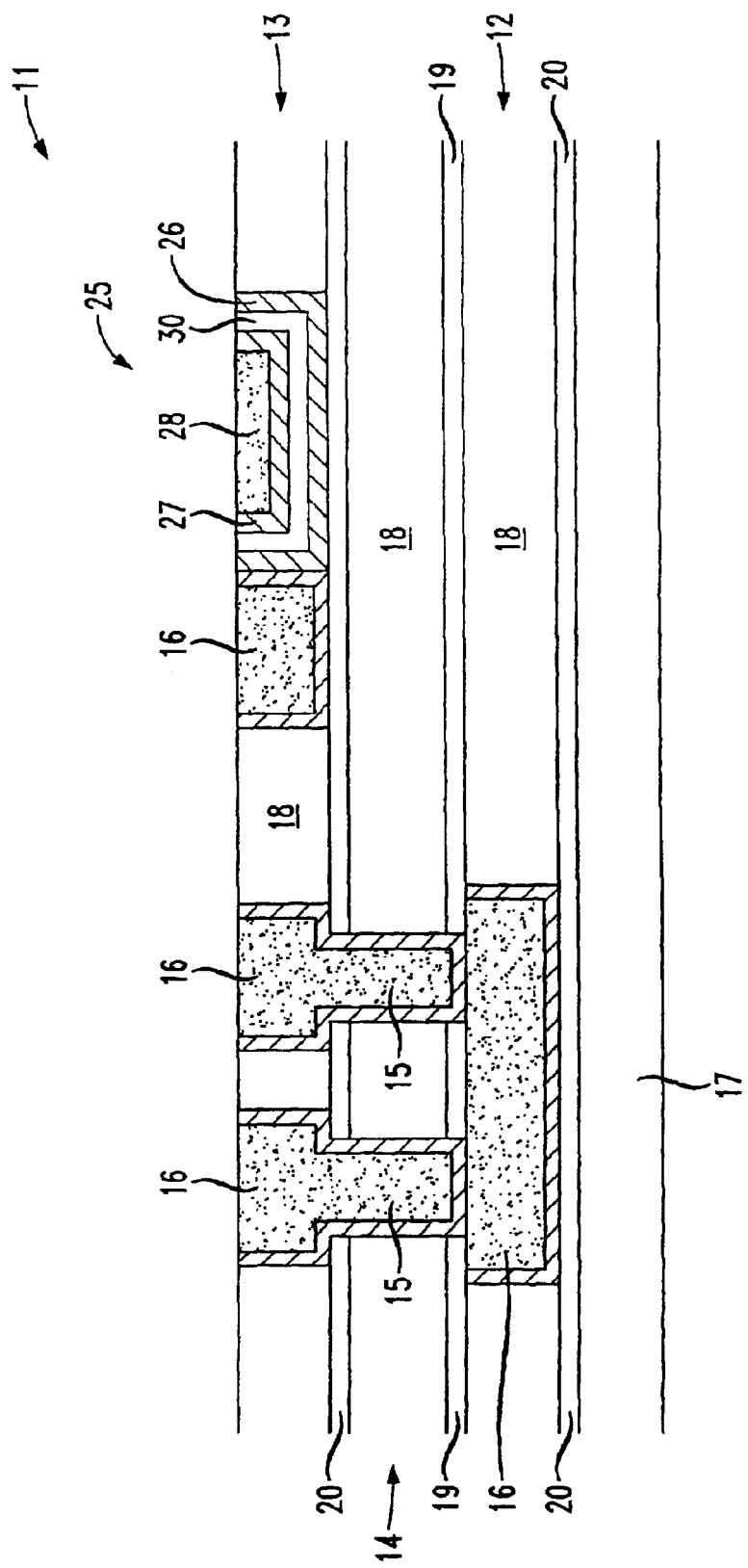
FIG. 5 is a partial sectional view of an interconnect structure of a semiconductor device having a capacitor formed in the trench.

With respect to FIGS. 3 through 5, the steps for forming a capacitor 25 within the trench 22 are shown. The capacitor 25 includes a first capacitor electrode 26 separated from a second capacitor electrode 27 by an insulator 30 interposed. The capacitor 25 may also be described as including a metal lead 28 formed over the second capacitor electrode 27. In the embodiment illustrated in FIG. 3, the electrodes 26 and 27, and insulator 30, are formed as films within the trench 22.

The first electrode 26 comprises a conductive metal or metal alloy that can be deposited or grown within the trench 22 adhering to the interior surfaces of the trench 22 and/or conforming to the sidewalls 23 and bottom 24 of the trench 22. For example, the first capacitor electrode 26 may comprise a refractory metal and/or a refractory metal alloy such as tantalum, titanium or tungsten and/or their corresponding nitrides or tantalum pentoxide. The first electrode 26 may be deposited using known procedures such as sputter deposition or chemical vapor deposition. As mentioned above the surface of the component 16 is exposed from etching the trench 22, so the first capacitor electrode 26 contacts the component 16 for electrical contact between the component 16 and the capacitor 25.

The insulator 30 is then deposited over the first capacitor electrode 26. The insulator 30 preferably comprises a dielectric material having a known dielectric constant. For example, the dielectric may include available dielectric materials such as silicon nitride or silicon dioxide. The insulator 30 is deposited or grown as a film conforming to the surface of the first capacitor electrode 26. The second capacitor electrode 27 is similarly formed within the trench 22 as a film conforming to the insulator 30. The second capacitor electrode 27 also comprises a conductive metal or metal alloy as described above with reference to the first capacitor electrode 26, and may be similarly formed within the recess 22 as described above.

In an advantageous embodiment, the electrode films may range in thickness from about 20 nanometers to about 50 nanometers. Similarly the insulator film 30 may range from about 20 nanometers to about 50 nanometers. Therefore the thickness of the capacitor can range from about 60 nm to about 150 nm.

As shown in FIG. 3, the films are blanket deposited over the device. In as much as the electrodes 26 and 27, and the insulator 30, are films conforming to the shape of the trench 22, a recess 31 is formed over the second electrode 27. A portion of the recess 31 extends within an interior of the trench 22. With respect to FIG. 4, a conductive metal is then deposited within the recess 31 to form the metal lead 28. According to a particularly advantageous embodiment, the conductive metal may comprise any metal suitable for conducting an electrical charge such as for example, silver, refractory metals or noble metals such as gold, platinum palladium and the like.

With respect to FIG. 5, the surface of the structure 11 is planarized such that the films 26, 27, 30 and the metal lead 28, do not extend outwardly of the trench 22. The planarization is accomplished by using a chemical-mechanical polishing (CMP) process such that a substantially planar surface is produced, wherein the first capacitor electrode 26, the insulator 30, the second capacitor electrode 27 and the metal lead 28 substantially fill the trench 22 to form a coplanar surface with the dielectric material 18. The metal lead 28 serves as a connection between the second electrode 27 and a second device component with which the capacitor 25 is placed in electrical communication.

Figure 6:
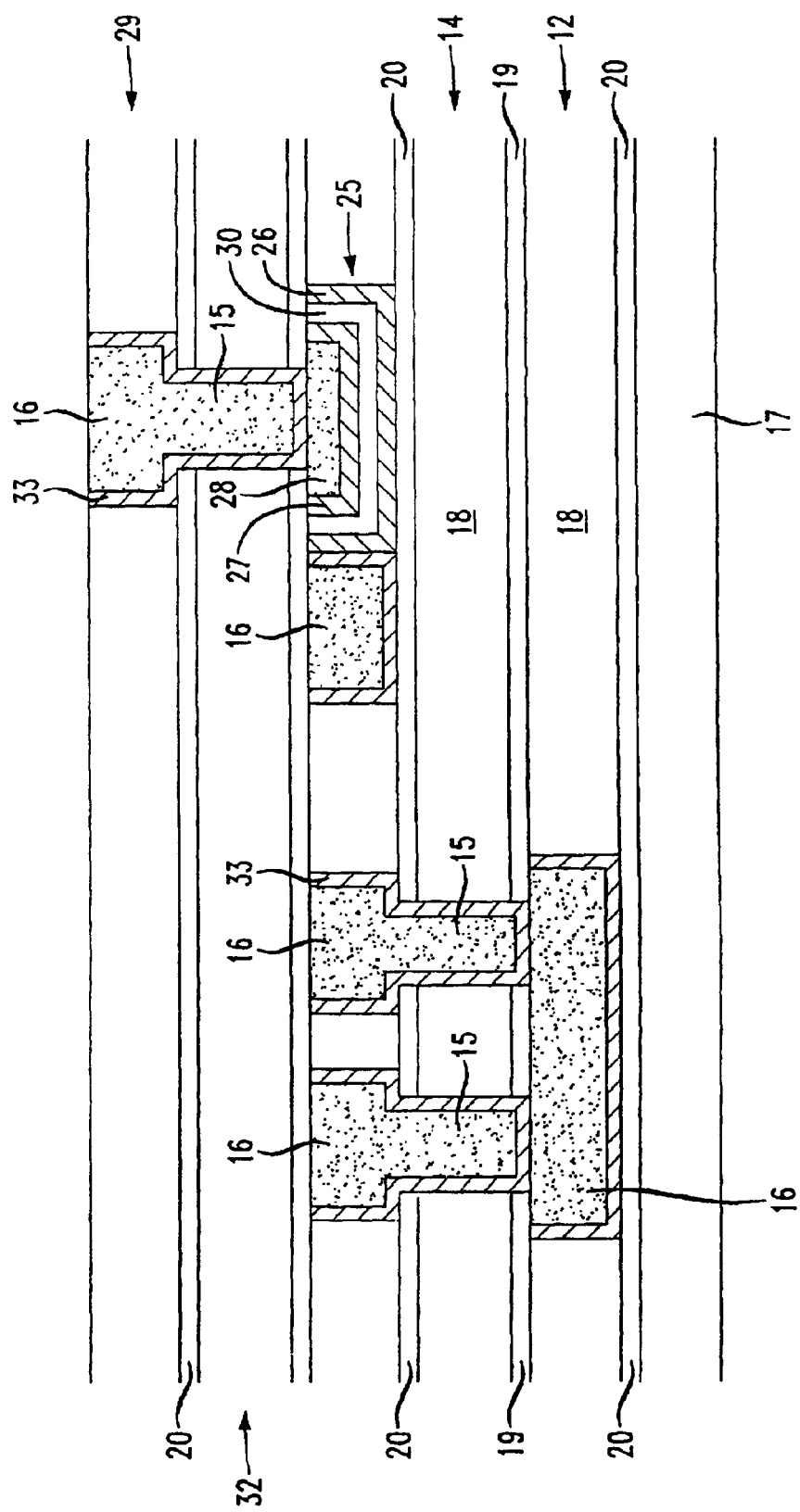
FIG. 6 is a partial sectional view of an interconnect structure of a semiconductor device having a trench capacitor and a device component fabricated over the interconnect structure.

As shown in FIG. 6, a metallization layer 29 and insulating layer 32 have been fabricated above the interconnect structure 11. The layers 29 and 32 may be constructed using a dual damascene process. A barrier layer 19 is first deposited over the upper metallization layer 13, and an etch stop layer 20 is interposed between layers 29 and 32. The metallization layer 29 includes components 16 disposed within a dielectric material 18, and the insulating layer 32 includes metal-filled vias 15 disposed in the dielectric material 18. A metal-filled via 15 interconnects the capacitor 25 to a component 16 in the layer 29. As shown in FIG. 6, a via is etched through the dielectric material 18 and the barrier layer 19 above the capacitor 25, and then filled with copper, which provides a continuous metal contact from the second electrode 27 to the component 16.

While the preferred embodiments of the present invention have been shown and described herein in the present context, it will be obvious that such embodiments are provided by way of example only and not of limitation. Numerous variations, changes and substitutions will occur to those of skilled in the art without departing from the invention herein. For example, the present invention need not be limited to best mode disclosed herein, since other applications can equally benefit from the teachings of the present invention. Accordingly, it is intended that the invention be limited only by the spirit and scope of the appended claims.

What is claimed is:

1. A semiconductor integrated circuit comprising a plurality of alternating metallization layers and dielectric layers with a capacitor formed entirely within a single metallization layer, wherein the metallization layer includes a dielectric material and said capacitor comprises a first capacitor electrode formed within a trench etched in the dielectric material and in electrical contact with a device component in the dielectric material, an insulator formed within the trench overlaying the first capacitor electrode, and a second capacitor electrode, overlaying the insulator, and in contact with another device component.

2. The circuit of claim 1 wherein said first capacitor electrode and the second capacitor electrode are formed from a refractory metal or refractory metal alloy.

3. The circuit of claim 2 wherein said refractory metal is selected from titanium, tungsten and tantalum or a combination thereof and said refractory metal alloy is selected from titanium nitride, tungsten nitride tantalum nitride or tantalum pentoxide or a combination thereof.

4. The circuit of claim 2 wherein said insulator is a dielectric material.

5. The circuit of claim 4 wherein said dielectric material comprises silicon nitride or silicon dioxide.

6. The circuit of claim 1 wherein said first capacitor electrode includes a film, comprising a conductive metal, conforming to an interior surface of the trench, and said insulator includes a second film, comprising a nonconductive material conformally overlaying the first film, and said second capacitor electrode, comprising a conductive metal conformally overlaying said second film and forming a recess over the second capacitor electrode and said metal lead includes a conductive metal filling said recess, and said capacitor having a top surface that is substantially coplanar with a top surface of the metal layer.

7. A semiconductor device comprising:
 (a) at least one metallization layer in an interconnect structure, having a device component, and including a conductive metal, formed within a nonconductive material using a damascene process; and
 (b) a capacitor formed in a trench etched in said nonconductive material, and having a first capacitor electrode in electrical contact with a first device component, and a second capacitor electrode in electrical contact with another device component.

8. The semiconductor device of claim 7 wherein said trench comprises sidewalls and a bottom and said capacitor comprises a first capacitor electrode film formed along the sidewalls and a bottom of the trench and in electrical contact with the first device component, an insulative film overlaying said first capacitor electrode film and a second capacitor electrode film overlaying said insulative film and in electrical contact with said second device component.

9. The semiconductor device of claim 8 wherein said first capacitor electrode film, said insulating film and said second electrode film are conformally deposited along the sidewalls and bottom of the trench forming a second recess over the insulating film, within which a conductive metal is deposited, and the capacitor having a top surface that is substantially coplanar with a top surface of the metallization layer.

10. A method for the fabrication of a semiconductor device, the method comprising the steps of:
 (a) etching a trench in a nonconductive material of a metallization layer, adjacent a device component, said trench having sidewalls and bottom;
 (b) forming a first capacitor electrode within the trench, in electrical contact with the device component;
 (c) forming an insulator within the trench overlaying the first capacitor electrode;
 (d) forming a second capacitor electrode within the trench overlaying the insulator; and
 (e) electrically connecting the second electrode to a second semiconductor device component.

11. The method of claim 10 further comprising the step of forming a metal lead within the trench overlaying the second capacitor electrode and in electrical contact with the second device component.

12. The method of claim 11 wherein said step of forming the first capacitor electrode comprises forming a first film, comprising a conductive metal, conformally over the sidewalls and the bottom of the trench, and said step of forming an insulator includes forming a second film, comprising a nonconductive material, conformally over the first film, and said step of forming a second capacitor electrode includes forming a third film, comprising a conductive metal, conformally over the second film.

13. The method of claim 12 further comprising the step of subsequently planarizing a surface of the device so the capacitor has a top surface that is substantially coplanar to a top surface of the metallization layer.

14. The method of claim 12 wherein said step of forming the capacitor further comprises forming a recess over the third film, and further comprising the step of depositing a conductive metal within the recess over the third film and filling the recess.

15. The method of claim 14 further including the step planarizing the device so the capacitor has a top surface that is substantially coplanar to a top surface of the metallization layer.

* * * * *